(12) United States Patent
Tamura

(10) Patent No.: US 6,317,866 B1
(45) Date of Patent: Nov. 13, 2001

(54) METHOD OF PREPARING CHARGED PARTICLE BEAM DRAWING DATA AND RECORDING MEDIUM ON WHICH PROGRAM THEREOF IS RECORDED

(75) Inventor: Takao Tamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/136,357

(22) Filed: Aug. 19, 1998

(30) Foreign Application Priority Data

Aug. 19, 1997 (JP) .................................................. 9-222094

(51) Int. Cl.$^7$ ........................... G06F 17/50; G06F 19/00; G06K 9/00
(52) U.S. Cl. .............................. 716/21; 700/110; 700/97; 700/121; 378/35; 382/1 AA
(58) Field of Search .................. 395/500.02–500.22; 716/1–21; 700/95–97, 108–110, 121; 364/468.015, 468.03, 468.15–468.17, 468.28; 378/34–35; 382/144

(56) References Cited

U.S. PATENT DOCUMENTS

| | | | |
|---|---|---|---|
| 4,789,945 | * | 12/1988 | Niijima ................................... 716/21 |
| 5,159,201 | * | 10/1992 | Frei ..................................... 250/492.2 |
| 5,166,888 | * | 11/1992 | Engelke .................................. 716/21 |
| 5,347,592 | * | 9/1994 | Yasuda et al. ......................... 382/144 |
| 5,698,859 | * | 12/1997 | Haruki .............................. 250/492.22 |
| 5,795,688 | * | 8/1998 | Burdorf et al. ......................... 430/30 |
| 5,801,954 | * | 9/1998 | Le et al. ................................. 716/21 |

FOREIGN PATENT DOCUMENTS

| | | | |
|---|---|---|---|
| 7-288224 | 10/1995 | (JP) ............................... H01L/21/27 |
| 4-372155 | 12/1992 | (JP) ............................... H01L/21/82 |

OTHER PUBLICATIONS

Allan et al. ("Hierarchical Critical Area Extraction with the EYE Tool", IEEE Comput. Soc. Press, Proceedings of the IEEE International Workshop on Defect and Fault Tolerance in VLSI Systems. Nov. 1995, pp. 28–36).*

Lin et al. ("A Circuit Disassembly Technique for Synthesizing Symbolic Layouts from Mask Descriptions", IEEE Transactions on Computer–Aided Design of Integrated Circuits and Systems, vol. 9, No. 9, Sep. 1990, pp. 959–968).*

Carlson et al. ("Mask verification on the Connection Machine", Proceedings of the 25th ACM/IEEE Design Automation Conference, 1988, Jun. 12, 1988, pp. 134–140).*

Garofalo et al. ("Automatic proximity correction of 0.35 /spl mu/m I–line photolithography", Nupad V., International Workshop on Numerical Modeling of Processes and Devices for Integrated Circuits, 1994, Jun. 5, 1994, pp. 92–94).*

Mandlik et al. ("PC based image analyser for mask inspection", 1989 Proceedings of Seventh IEEE/CHMT International Electronic Manufacturing Technology Symposium, Sep. 25, 1989, pp. 327–329A).*

* cited by examiner

*Primary Examiner*—Matthew Smith
*Assistant Examiner*—Phallaka Kik

(57) ABSTRACT

In a charged particle beam drawing data preparing method of preparing drawing pattern data used in a charged particle beam drawing apparatus that forms a micropattern with a charged particle by converting CAD data, it is verified by using interlayer calculation whether a difference exists between the CAD data and the drawing pattern data. When it is verified that a difference exists between the CAD data and the drawing apparatus pattern data, drawing pattern data that compensates for this difference is generated by using interlayer calculation.

7 Claims, 9 Drawing Sheets

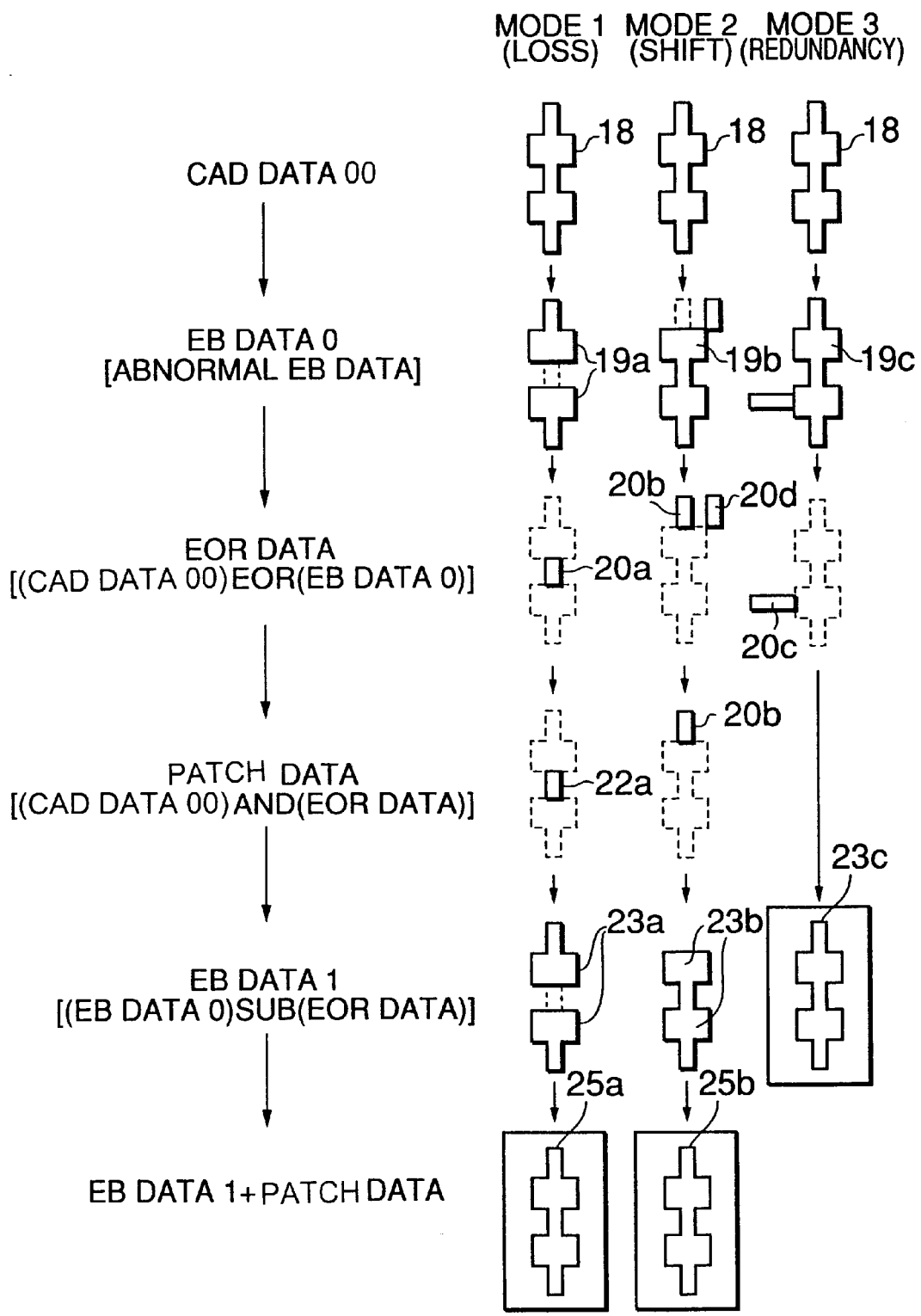

METHOD OF PREPARING CHARGED PARTICLE BEAM DRAWING DATA AND RECORDING MEDIUM ON WHICH PROGRAM THEREOF IS RECORDED

BACKGROUND OF THE INVENTION

1. Field of the Invention

The present invention relates to a pattern data preparing method used in a charged particle beam drawing apparatus that prepares a micropattern with a charged particle beam and, more particularly, to a pattern data preparing method of obtaining highly reliable pattern data.

2. Description of the Prior Art

Along with the development of LSIs, patterns used in semiconductor devices continue to shrink rapidly in feature size. The charged particle beam drawing method using a charged particle beam is an effective method capable of forming a pattern with a size of 0.25 μm or less which will be needed in the future. As a charged particle beam drawing apparatus, a variable shaping type electron beam drawing apparatus as shown in FIG. 1 is used. According to this apparatus, an electron beam is shaped to have a rectangular spot with a first aperture 3 and a second aperture 6. A resultant electron beam 50B is radiated onto a semiconductor wafer 11 coated with a resist, thereby forming a micropattern.

Referring to FIG. 1, an electron beam 50 emitted from an electron gun 1 passes through a blanking electrode 2, the first aperture 3, a shaping lens 4, a shaping deflector 5, the second aperture 6, a reduction lens 7, a main deflector 8, a sub-deflector 9, and a projection lens 10 to irradiate the semiconductor wafer 11 on a stage. A square opening 3A is formed in the first aperture 3 to form a rectangular beam 50A. The rectangular beam 50A passes through an opening 6A of the second aperture 6 to have a small-size square beam spot. Shot (one exposure operation) is repeated with this small-size electron beam 50B to form one latent image pattern in the resist on the semiconductor wafer 11.

A storage unit 15 stores figure data. The figure data is read by a computer 14 and temporarily stored in a figure data memory 17. The drawing apparatus reads this figure data as required, converts it into a control signal with a controller 16, and controls the blanking electrode 2, the shaping deflector 5, the main deflector 8, and the sub-deflector 9 to draw a figure. This figure data is obtained by subjecting CAD data to overlapping removal, proximity effect correction, and the like and converting the resultant CAD data into a specific format for the drawing apparatus. Japanese Unexamined Patent Publication No. 7-288224 describes a method that uses interlayer calculation in order to prevent occurrence of deformation of the pattern on the cell boundary when enlargement and reduction are performed while retaining the hierarchical cell structure. Japanese Unexamined Patent Publication No. 4-372155 describes a method of comparing and verifying the LSI layout pattern, outputting the coordinates of different points, and correcting the layout pattern by using an editor.

In recent years, as the integration degree of semiconductor devices as objects on which patterns are to be drawn increases, the number of patterns to be drawn becomes very large, and the amount of data handled by the conversion software also increases very much. For this reason, batch processing is widely performed. More specifically, a semiconductor chip is divided, and conversion is performed in units of batch process regions. After conversion for all the regions is ended, obtained data are combined to prepare 1-chip data. When this batch processing is performed, it is difficult to handle a pattern crossing the boundary or boundaries between more than one region. Sometimes pattern losses, generation of a redundant pattern, or positional shifts may occur in the data after conversion. If data having such a defect is directly used for drawing, it produces interconnect disconnections, short-circuits, or the like to lead to a decrease in yield of devices. Therefore, it is important to verify whether converted data is different from the original CAD data. Japanese Unexamined Patent Publication No. 7-288224 provides no means for verifying such defects of the pattern data. According to Japanese Unexamined Patent Publication No. 4-372155, the layout pattern is directly corrected with reference to the coordinates of different points, and the corrected data is converted into drawing data again. Accordingly, a very long process time is required to obtain normal drawing data. Since correction is manually performed by the operator, a new defective portion may be undesirably formed during the course of correction.

SUMMARY OF THE INVENTION

The present invention has been made in consideration of the above situation in the prior art, and has as its object to provide a method of preparing charged particle beam drawing data, which can quickly correct any calculation error that occurs when converting CAD data into pattern data without forming a new defective portion, and a recording medium on which a program thereof is recorded.

In order to achieve the above object, according to the first aspect of the present invention, there is provided a charged particle beam drawing data preparing method of preparing drawing pattern data used in a charged particle beam drawing apparatus that forms a micropattern with a charged particle by converting CAD data, the method comprising the steps of verifying, by using interlayer calculation, whether a difference exists between the CAD data and the drawing pattern data, and when it is verified in the verifying step that a difference exists between the CAD data and the drawing apparatus pattern data, generating drawing pattern data that compensates for this difference by using interlayer calculation.

According to the second aspect of the present invention, there is provided a charged particle beam drawing data preparing method of preparing pattern data used in a charged particle beam drawing apparatus that forms a micropattern with a charged particle, wherein when a difference exists between original CAD data and drawing apparatus pattern data, pattern data that compensates for this difference is generated by using interlayer calculation.

According to the third aspect of the present invention, there is provided a charged particle beam drawing data preparing method according to the second aspect, comprising, as means for generating the compensation pattern data, the steps of performing an exclusive logical sum operation (eor) between the original CAD data and the drawing apparatus pattern data having pattern loss, and outputting, as drawing pattern data, both the drawing apparatus pattern data having the pattern loss and pattern data obtained by the exclusive logical sum operation.

According to the fourth aspect of the present invention, there is provided a charged particle beam drawing data preparing method according to the second aspect, comprising, as means for generating the compensation pattern data, the steps of performing an exclusive logical sum operation (eor) between the original CAD data and the drawing apparatus pattern data having a pattern shift, performing a logical product operation (and) between the original CAD data and pattern data obtained by the exclusive logical sum operation, performing a logical difference operation (sub) between the drawing apparatus pattern data having the pattern shift and the pattern data obtained by the exclusive logical sum operation, and outputting, as drawing pattern data, both the pattern data obtained by the logical difference operation and the pattern data obtained by the logical product operation.

According to the fifth aspect of the present invention, there is provided a charged particle beam drawing data preparing method according to the second aspect, comprising, as means for generating the compensation pattern data, the steps of performing an exclusive logical sum operation (eor) between the original pattern data and the drawing apparatus pattern data having a redundant pattern, performing a logical difference operation (sub) between the redundant pattern and the pattern data obtained by the exclusive logical sum operation, and outputting, as drawing pattern data, the pattern data obtained by the logical difference operation.

According to the sixth aspect of the present invention, there is provided a charged particle beam drawing data preparing method according to the second aspect, comprising, as means for generating the compensation pattern data, the steps of performing an exclusive logical sum operation (eor) between the original CAD data and drawing apparatus pattern data having pattern losses, pattern shifts, and redundant patterns, performing a logical product operation (and) between the original cad data and pattern data obtained by the exclusive logical sum operation, performing a logical difference operation (sub) between the drawing apparatus pattern data having pattern losses, pattern shifts, and redundant patterns, and the pattern data obtained by the exclusive logical sum operation, and determining whether the number of figures of the pattern data obtained by the logical product operation is 0, wherein if the number of figures of the pattern data obtained by the logical product operation is 0, the pattern data obtained by the logical difference operation is output as the drawing data; otherwise, both the pattern data obtained by the logical difference operation and the pattern data obtained by the logical product operation are output as the drawing data.

According to the seventh aspect of the present invention, there is provided a machine-readable recording medium, on which is recorded a program of preparing charged particle beam drawing data, used in a charged particle beam drawing apparatus that forms a micropattern with a charged particle by converting CAD data with a computer, the program serving to cause the computer to execute the steps of verifying, by using interlayer calculation, whether a difference exists between the CAD data and the drawing data, and when it is verified in the verifying step that a difference exists between the CAD data and the drawing data, generating drawing pattern data that compensates for the difference by using interlayer calculation.

As is apparent from the respective aspects described above, according to the present invention, when converting CAD data into the drawing apparatus pattern data, even if a calculation error occurs, pattern data that compensates for the error can be automatically generated by using interlayer calculation. Therefore, the error can be corrected quickly. Since the original CAD data is not manipulated, no new defective portion will be formed. As a result, disconnections and short-circuits of the semiconductor devices can be prevented, thereby improving the yield.

Although the present invention has been described by way of an electron beam direct drawing apparatus, the present invention can also be applied to an optical exposure reticle drawing apparatus, i.e., a so-called a mask drawing apparatus. The charged particle beam is not limited to the electron beam, but the present invention can also be applied to a drawing apparatus which uses an ion beam as a charged particle beam.

The above and many other objects, features and advantages of the present invention will become manifest to those skilled in the art upon making reference to the following detailed description and accompanying drawings in which preferred embodiments incorporating the principles of the present invention are shown by way of illustrative examples.

BRIEF DESCRIPTION OF THE DRAWINGS

FIG. 9 is a diagram explaining the data preparing method according to the fourth embodiment shown in FIG. 8.

DETAILED DESCRIPTION OF THE PREFERRED EMBODIMENTS

The present invention will be described in detail with reference to the several preferred embodiments shown, in the accompanying drawings.

Figure 1:
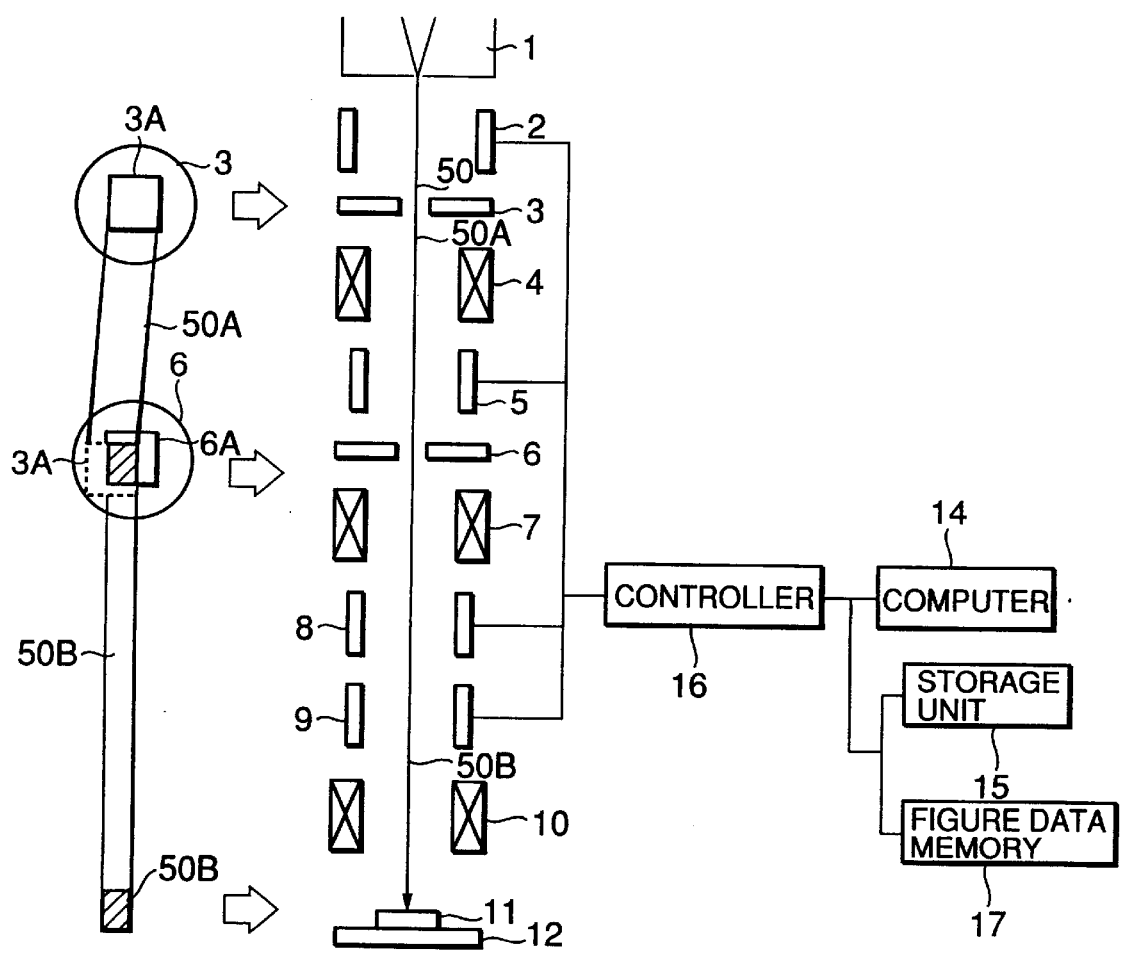
FIG. 1 is a diagram showing the arrangement of a conventional charged particle beam drawing apparatus.
Figure 2:
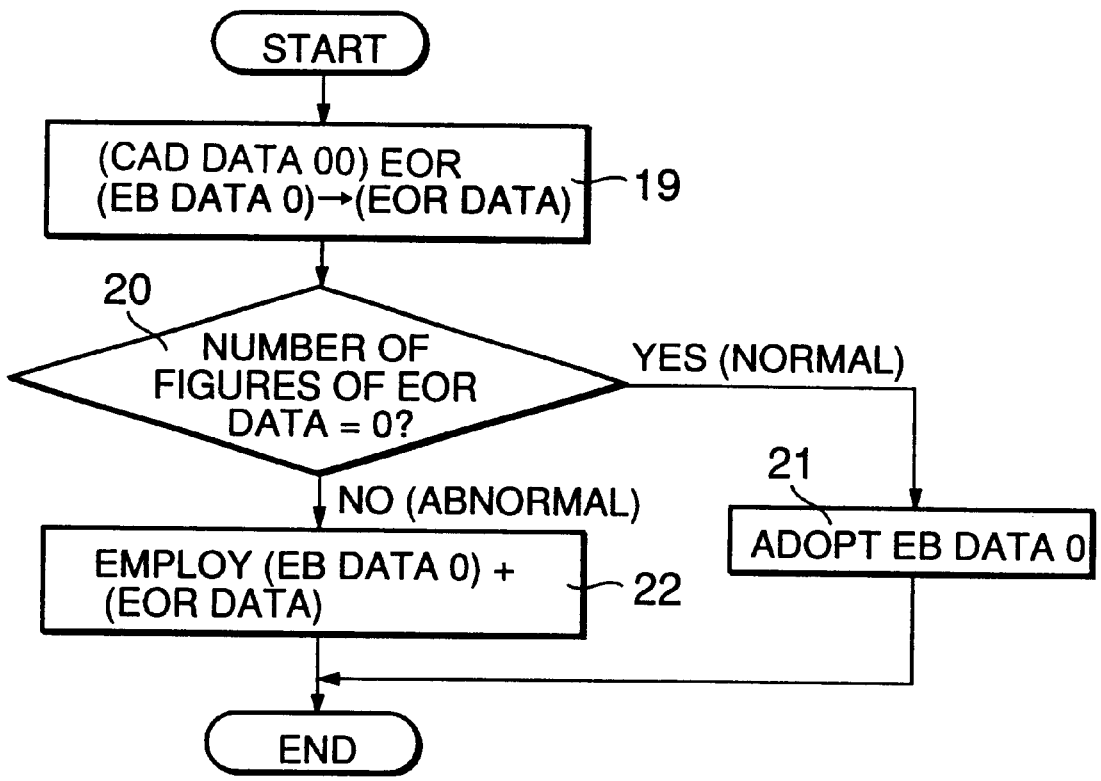
FIG. 2 is a flow chart showing a method of preparing charged particle beam drawing data according to the first embodiment of the present invention.

FIG. 2 is a flow chart showing a method of preparing charged particle beam drawing data according to the first embodiment of the present invention. This flow chart shows the process of verifying whether drawing pattern data is different from the original CAD data and, if an abnormality is found, generating data that compensates for the abnormality. The arrangement of a charged particle beam drawing apparatus to which the method of preparing charged particle beam drawing data according to the present invention is identical to the conventional one shown in FIG. 1. Accordingly, in all the following embodiments, illustration of this apparatus will be omitted. The method of preparing charged particle beam drawing data according to the present invention is executed by a computer 14 of FIG. 1.

In this embodiment, drawing pattern data obtained by converting CAD data 00 is referred to as EB data 0. First, the exclusive logical sum (eor) between CAD data 00 and EB data 0 is calculated to obtain eor data (step 19). Whether the number of figures of eor data is 0 is checked (step 20). If YES in step 20, it is determined that EB data 0 is normal, and EB data 0 is output as the drawing data (step 21).

If NO in step 20, it is determined that EB data 0 has an abnormality, and the flow advances to a compensation data generation step. The eor data is added to EB data 0 to generate compensation data (drawing data) (step 22), and the processing operation is ended.

Figure 3:
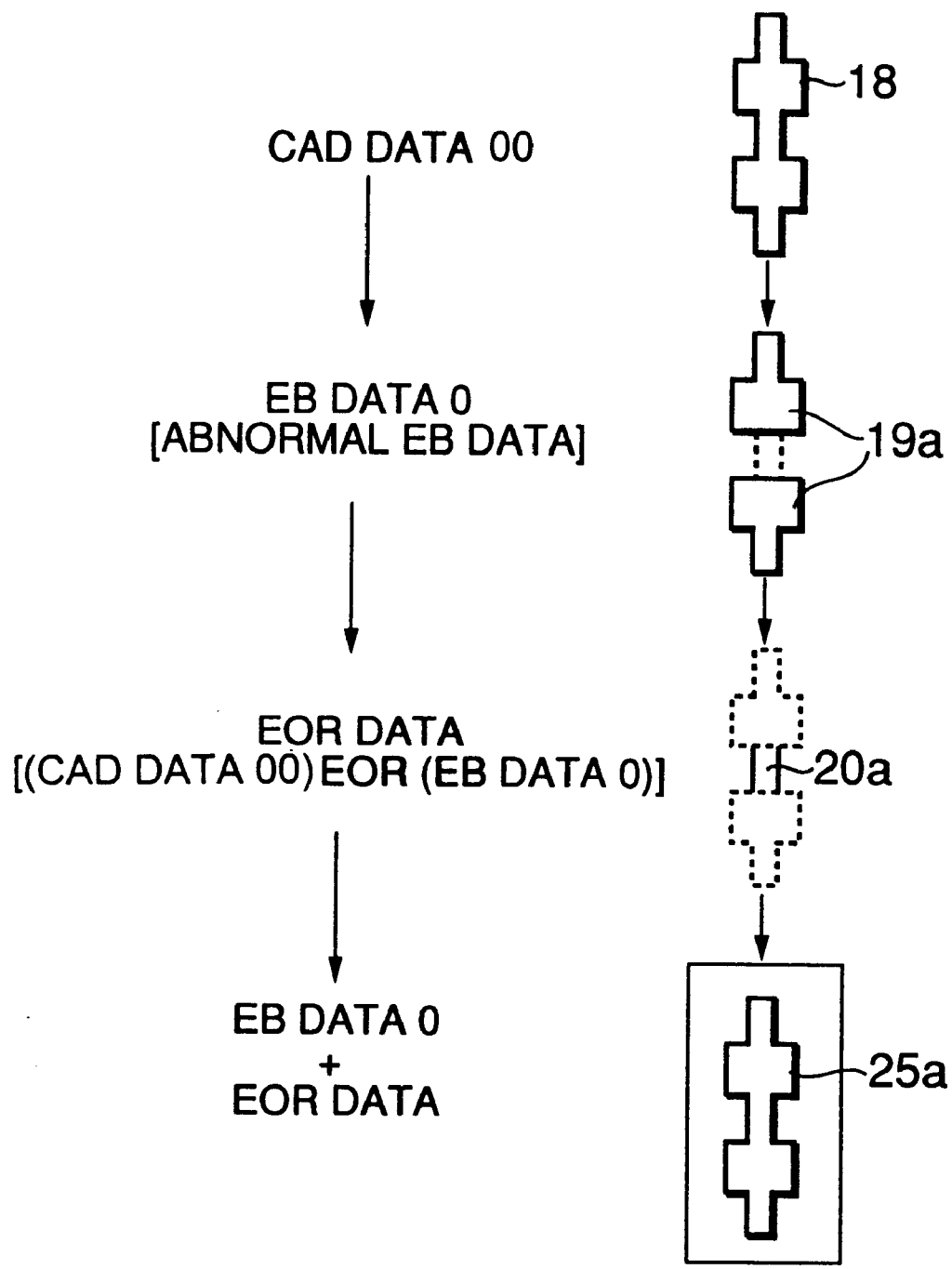
FIG. 3 is a diagram explaining the data preparing method according to the first embodiment shown in FIG. 2.

FIG. 3 is a view explaining a case wherein pattern loss occurs when converting the CAD data into the drawing pattern data. In this case, when the CAD data 18 is converted into drawing data by applying the method of preparing charged particle beam drawing data described above, EB data 19a (EB data 0) is generated. In step 19, the exclusive logical sum between the CAD data 18 and the EB data 19a is calculated. As the result of this exclusive logical sum operation, a FIG. 20a of a portion where pattern loss has occurred is extracted as eor data. In step 22, both the EB data 19a and the eor data 20a are output as drawing data. Drawing data 25a which is not different from the CAD data 18 can be obtained, and the pattern loss defect can be compensated for.

Figure 4:
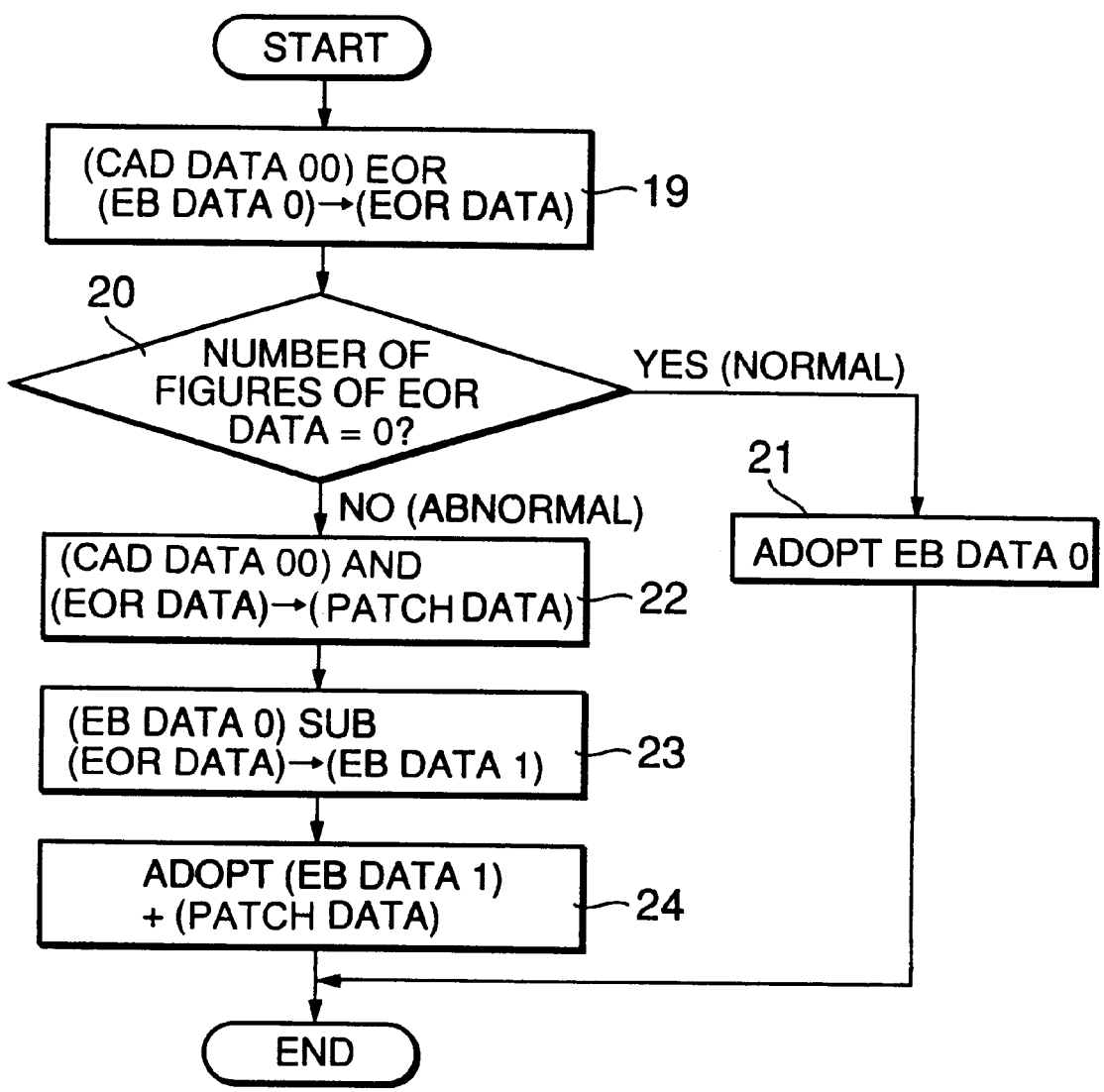
FIG. 4 is a flow chart showing a method of preparing charged particle beam drawing data according to the second embodiment of the present invention.

FIG. 4 is a flow chart showing a method of preparing charged particle beam drawing data according to the second embodiment of the present invention. This flow chart shows the process of verifying whether drawing pattern data is different from the original CAD data and, if an abnormality is found, generating data that compensates for the abnormality. In this embodiment, drawing pattern data obtained by converting CAD data 00 is referred to as EB data 0. First, the exclusive logical sum (eor) between CAD data 00 and EB data 0 is calculated to obtain eor data (step 19). Whether the number of figures of eor data is 0 is checked (step 20). If YES in step 20, it is determined that EB data 0 is normal, and EB data 0 is output as the drawing data (step 21). If NO in step 20, it is determined that EB data 0 has an abnormality, and the flow advances to step 22 for generating compensation data.

In step 22, the logical product (and) between the CAD data and the eor data is calculated to extract patch data including only patterns that should exist. Subsequently, the logical difference (sub) between EB data 0 and the eor data to generate EB data 1 is calculated (step 23). The patch data described above is added to EB data 1. The sum is output as the drawing data (step 24), and the processing operation is ended.

Figure 5:
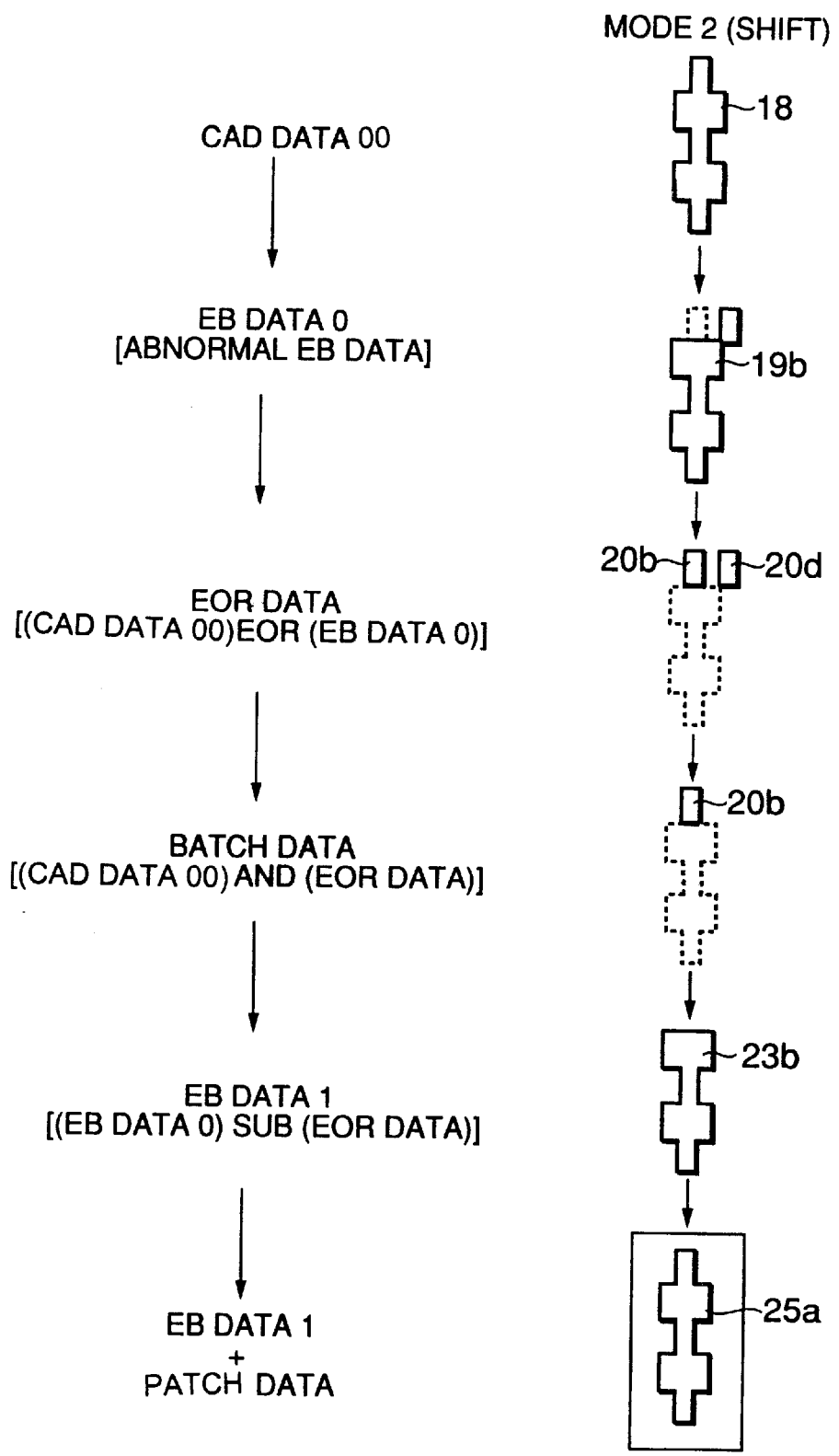
FIG. 5 is a diagram explaining the data preparing method according to the second embodiment shown in FIG. 4.

FIG. 5 is a view explaining a case wherein a positional shift has occurred when converting the CAD data into the drawing pattern data. In this case, when CAD data 18 is converted into drawing data by applying the method of preparing charged particle beam drawing data described above, EB data 19b (EB data 0) is generated. In step 19, the exclusive logical sum between the CAD data 18 and the EB data 19b is calculated. As the result of this exclusive logical sum operation, a pattern 20b that should originally exist and a pattern 20d that should not exist are extracted.

Furthermore, the logical product (and) between the CAD data and the eor data (step 22) is calculated to extract only the pattern 20b (patch pattern) which should exist. Subsequently, the logical difference (sub) between the EB data 19b, and the eor data 20b and 20d is calculated to generate EB data 23b (step 23). Data as the sum of the EB data 23b and the patch data 20b is output as the drawing data to obtain drawing data 25b which is not different from the CAD data (step 24). As a result, drawing data which is not different from the CAD data can be obtained, and the positional shift defect can be compensated for.

Figure 6:
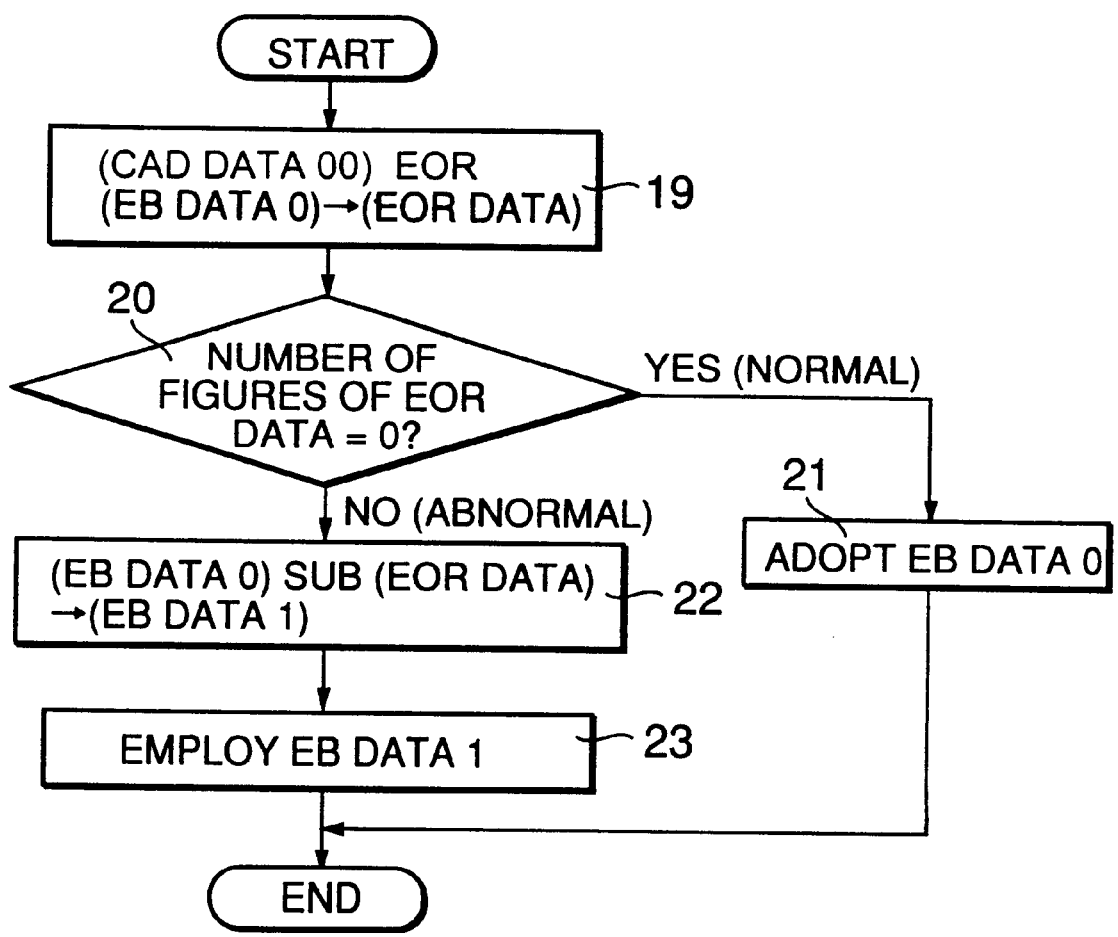
FIG. 6 is a flow chart showing a method of preparing charged particle beam drawing data according to the third embodiment of the present invention.

FIG. 6 is a flow chart showing a method of preparing charged particle beam drawing data according to the third embodiment of the present invention. This flow chart shows the process of verifying whether drawing pattern data is different from the original CAD data and, if an abnormality has occurred, generating data that compensates for the abnormality. In this embodiment, drawing pattern data obtained by converting CAD data 00 is referred to as EB data 0.

First, the exclusive logical sum (eor) is calculated between CAD data 00 and EB data 0 to obtain eor data (step 19). Whether the number of figures of the eor data is 0 is checked (step 20). If YES in step 20, it is determined that EB data 0 is normal, EB data 0 is output as the drawing data (step 21), and the processing operation is ended. If NO in step 20, it is determined that EB data 0 has an abnormality, and the flow advances to step 22 for generating compensation data. In step 22, the logical difference between EB data 0 and the eor data is calculated to generate EB data 1. EB data 1 is output as the drawing data (step 23), and the processing operation is ended.

Figure 7:
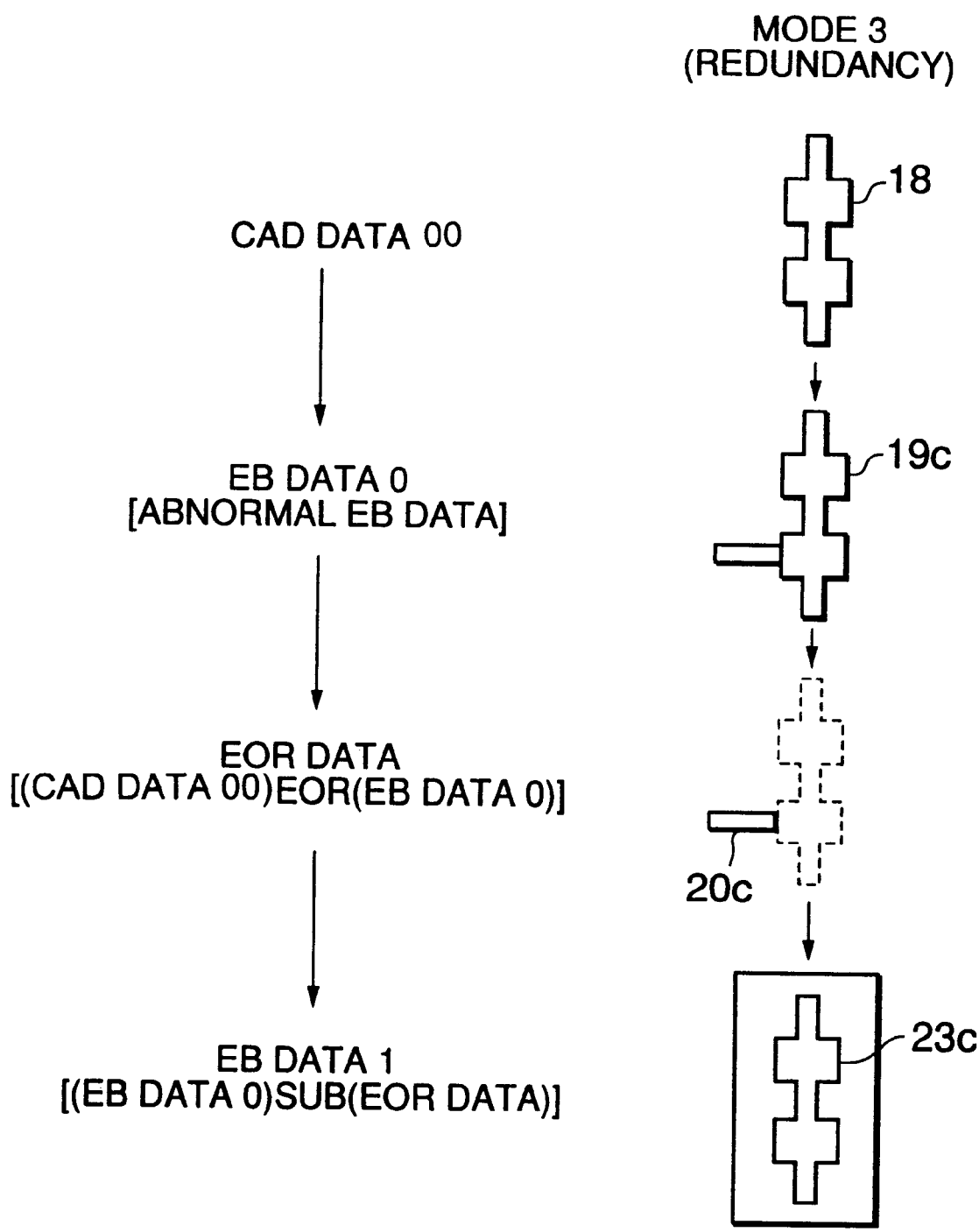
FIG. 7 is a diagram explaining the data preparing method according to the third embodiment shown in FIG. 6.

FIG. 7 is a view explaining a case wherein a redundant pattern is generated when converting the CAD data into the drawing pattern data. In this case, when CAD data 18 is converted into the drawing data by applying the method of preparing charged particle beam drawing data described above, EB data 19c (EB data 0) is generated. In step 19, the exclusive logical sum between the CAD data 18 and the EB data 19c is calculated. As the result of this exclusive logical sum operation, an abnormally generated pattern 20c is extracted as eor data. Subsequently, the logical difference (sub) between the EB data 19c and the eor data 20c (step 22) is calculated to generate EB data 23c. The EB data 23c is a pattern which is not different from the CAD pattern. The EB data 23c is directly output as the drawing data (step 23). Hence, the redundant pattern generation defect can be compensated for.

Figure 8:
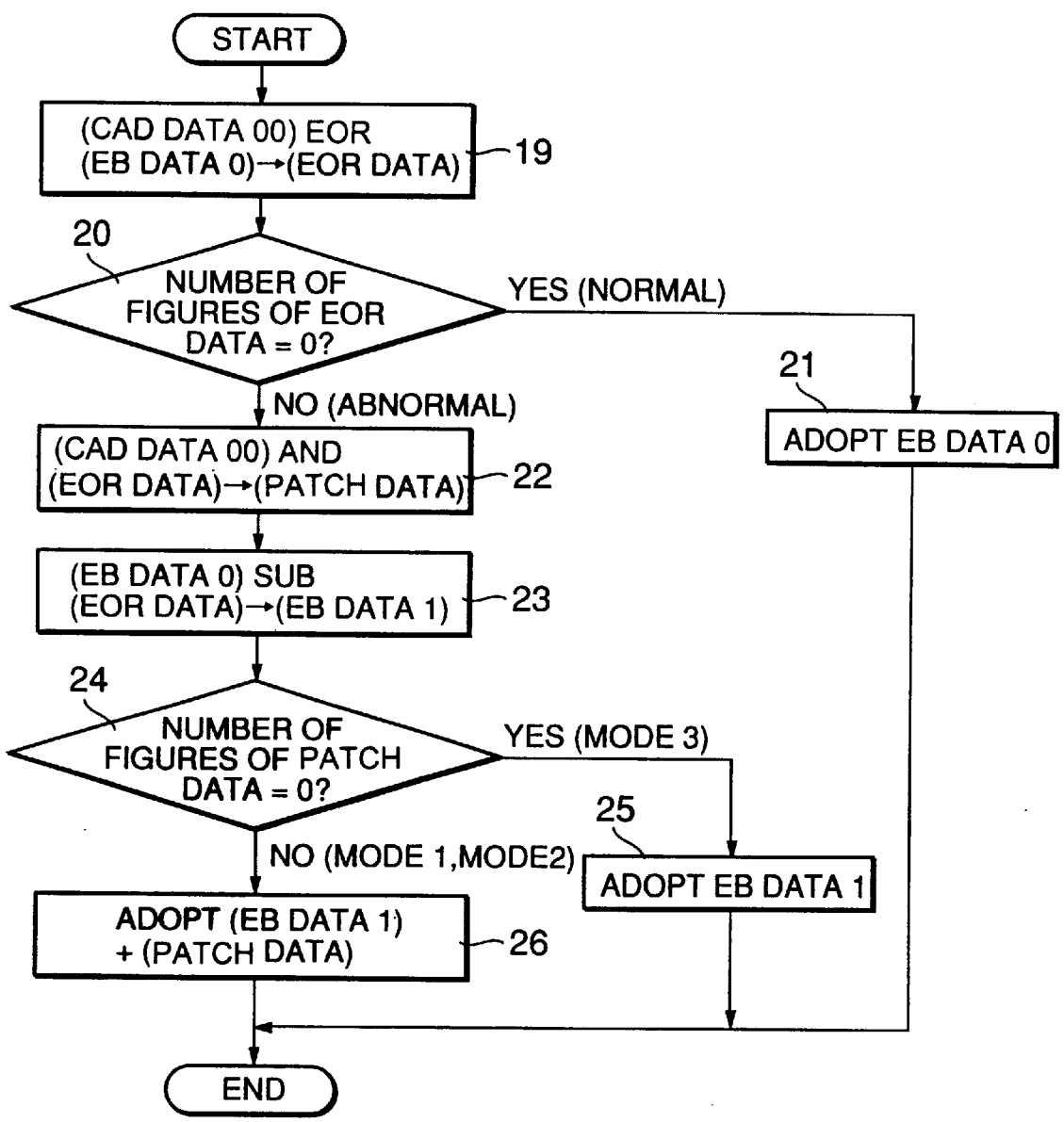
FIG. 8 is a flow chart showing a method of preparing charged particle beam drawing data according to the fourth embodiment of the present invention.

FIG. 8 is a flow chart showing a method of preparing charged particle beam drawing data according to the fourth embodiment of the present invention. This flow chart shows the process of verifying whether drawing pattern data is different from the original CAD data and, if an abnormality has occurred, generating data that compensates for the abnormality. In this embodiment, drawing pattern data obtained by converting CAD data 00 is referred to as EB data 0.

First, the exclusive logical sum (eor) between CAD data 00 and EB data 0 is calculated to obtain eor data (step 19). Whether the number of figures of eor data is 0 is checked (step 20). If YES in step 20, it is determined that EB data 0 is normal, EB data 0 is output as the drawing data (step 21), and the processing operation is ended. If NO in step 20, it is determined that EB data 0 has an abnormality, and the flow advances to step 22 for generating compensation data.

The logical product (and) between CAD data 00 and the eor data is calculated to generate patch data (step 22). Subsequently, the logical difference (sub) between EB data 0 and the eor data is calculated to generate EB data 1 (step 23). In order to discriminate each defective mode, whether the number of figures of the patch data is 0 is checked (step 24). If YES in step 24, it is determined that this is mode 3 (generation of a redundant pattern), and EB data 1 is adopted as the drawing data (step 25). If NO in step 24, it is determined that this is mode 1 (pattern loss) or mode 2 (positional shift), and data as the sum of EB data 1 and patch data is output as the drawing data (step 26).

FIG. 9 is a view explaining a case wherein all of the defects described in the first to third embodiments of the present invention described above are included in EB data 0. In other words, in this case, a pattern loss, a positional shift, and generation of a redundant pattern have occurred. In such a case, when the CAD data 18 is converted into the drawing data by employing the method of creating charged particle beam drawing data described above, EB data 19a to 19c (EB data 0) is generated. In step 19, the exclusive logical sum between the CAD data 18 and the EB data 19a to 19c is calculated. As the result of the exclusive logical sum operation, at least one of a pattern loss, a positional shift, and generation of a redundant pattern generates eor data. In other words, when a pattern loss occurs, eor data 20a is generated. When a positional shift occurs, error data 20b and 20d are generated. When a redundant pattern is generated, eor data 20c is generated.

Thereafter, the logical product (and) between the CAD data 18 and the eor data (20a to 20d) is calculated (step 22). As a result, in a pattern having a defect of mode 1 (loss), patch data 22a similar to the eor data is generated. In a pattern having a defect of mode 2 (shift), a pattern 20b that should originally exist is extracted. In a pattern having a defect of mode 3 (generation), no common portion is present between the CAD data 18 and the eor data 20c, and nothing remains accordingly.

The logical difference (sub) between EB data 0 (19a to 19c) and the eor data (20a to 20d) is calculated (step 23). As a result, in a pattern having a defect of mode 1 (loss), a pattern (23a) identical to EB data 0 (19a) is generated. In a pattern having a defect of mode 2 (shift), a pattern 23b obtained by subtracting the pattern 20b, that should originally exist, from the CAD data 18 is generated. In a pattern having a defect of mode 3 (generation), a pattern 23c which is not different from the CAD data is generated. In order to discriminate each defective mode, whether the number of figures of the patch data is 0 is checked (step 24).

If YES in step 24, it is determined that this is mode 3 (generation), and the EB data 23c is adopted as the drawing data (step 25). If NO in step 24, it is determined that this is mode 1 or mode 2, and data 25a as the sum of the EB data 23a and the patch data 22a, or data 25b as the sum of the EB data 23b and the patch data 20b, is adopted as the drawing data (step 26).

With the above steps, for EB data having defects of mode 1 to mode 3, pattern data that compensates for these defects can be generated. A decrease in yield caused by data errors occurring during data conversion can thus be prevented.

What is claimed is:

1. A charged particle beam drawing data preparing method comprising the steps of:
   preparing drawing pattern data used in a charged particle beam drawing apparatus that forms a micro pattern with a charged particle by converting CAD data;
   verifying, by using interlayer calculation, whether a difference exists between the CAD data and the drawing pattern data; and
   when it is verified in the verifying step that a difference exists between the CAD data and the drawing apparatus pattern data, generating drawing pattern data that compensates for said difference by using interlayer calculation.

2. A charged particle beam drawing data preparing method comprising the steps of:
   preparing pattern data used in a charged particle beam drawing apparatus that forms a micropattern with a charged particle and generating a compensation pattern data, wherein when a difference exists between original CAD data and drawing apparatus pattern data, pattern data that compensates for said difference is generated by using interlayer calculation.

3. A method according to claim 2, wherein the step of generating the compensation pattern data includes the steps of:
   performing an exclusive logical sum operation (eor) between the original CAD data and the drawing apparatus pattern data having pattern loss; and
   outputting, as drawing pattern data, both the drawing apparatus pattern data having the pattern loss and pattern data obtained by the exclusive logical sum operation.

4. A method according to claim 2, wherein the step of generating the compensation pattern data includes the steps of:
   performing an exclusive logical sum operation (eor) between the original CAD data and the drawing apparatus pattern data having a pattern shift;
   performing a logical product operation (and) between the original CAD data and pattern data obtained by the exclusive logical sum operation;
   performing a logical difference operation (sub) between the drawing apparatus pattern data having the pattern shift and the pattern data obtained by the exclusive logical sum operation; and
   outputting, as drawing pattern data, both the pattern data obtained by the logical difference operation and the pattern data obtained by the logical product operation.

5. A method according to claim 2, wherein the step of generating the compensation pattern data includes the steps of:
   performing an exclusive logical sum operation (eor) between the original pattern data and the drawing apparatus pattern data having a redundant pattern;
   performing a logical difference operation (sub) between the redundant pattern and the pattern data obtained by the exclusive logical sum operation; and
   outputting, as drawing pattern data, the pattern data obtained by the logical difference operation.

6. A method according to claim 2, wherein the step of generating the compensation pattern data includes the steps of:
   performing an exclusive logical sum operation (eor) between the original CAD data and drawing apparatus pattern data having pattern losses, pattern shifts, and redundant patterns;
   performing a logical product operation (and) between the original CAD data and pattern data obtained by the exclusive logical sum operation;
   performing logical difference operation (sub) between the drawing apparatus pattern data having pattern losses, pattern shifts, and redundant patterns, and the pattern data obtained by the exclusive logical sum operation; and
   determining whether the number of figures of the pattern data obtained by the logical product operation is 0, wherein
   if the number of figures of the pattern data obtained by the logical product operation is 0, the pattern data obtained by the logical difference operation is output as the drawing data; otherwise, both the pattern data obtained by the logical difference operation and the pattern data obtained by the logical product operation are output as the drawing data.

7. A machine-readable recording medium on which is recorded a program of preparing charged particle beam drawing data, used in a charged particle beam drawing apparatus that forms a micropattern with a charged particle by converting CAD data with a computer, the program causing said computer to execute the steps of:

verifying, by using interlayer calculation, whether a difference exists between the CAD data and the drawing data; and when it is verified in the verifying step that a difference exists between the CAD data and the drawing data, generating drawing pattern data that compensates for the difference by using interlayer calculation.